(12) United States Patent
Qin

(10) Patent No.: US 12,339,208 B2
(45) Date of Patent: Jun. 24, 2025

(54) MATERIAL HANDLING SYSTEM AND MONITORING SYSTEM AND MONITORING METHOD FOR PARTICLES IN TRAVELING AREA OF OVERHEAD HOIST TRANSFERS

(71) Applicant: CHANGXIN MEMORY TECHNOLOGIES, INC., Anhui (CN)

(72) Inventor: Yuanzhang Qin, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 974 days.

(21) Appl. No.: 17/433,816

(22) PCT Filed: Mar. 1, 2021

(86) PCT No.: PCT/CN2021/078433
§ 371 (c)(1),
(2) Date: Aug. 25, 2021

(87) PCT Pub. No.: WO2021/175182
PCT Pub. Date: Sep. 10, 2021

(65) Prior Publication Data
US 2023/0138019 A1    May 4, 2023

(30) Foreign Application Priority Data

Mar. 2, 2020   (CN) .......................... 202010135719.1

(51) Int. Cl.
*G01N 15/00* (2024.01)
*B66C 13/00* (2006.01)
(Continued)

(52) U.S. Cl.
CPC .......... *G01N 15/0211* (2013.01); *B66C 13/00* (2013.01); *B66C 15/065* (2013.01);
(Continued)

(58) Field of Classification Search
CPC .... G01N 1/2273; G01N 1/24; G01N 15/0205; G01N 15/0211; G01N 15/06;
(Continued)

(56) References Cited

U.S. PATENT DOCUMENTS 8,531,664 B2    9/2013 Nagaike
11,183,409 B2    11/2021 Li et al.
(Continued)

FOREIGN PATENT DOCUMENTS

CN    101968431 A    2/2011
CN    202044878 U    11/2011
(Continued)

OTHER PUBLICATIONS

International Search Report cited in PCT/CN2021/078433 mailed Jun. 1, 2021, 10 pages.
(Continued)

*Primary Examiner* — Michelle M Iacoletti
*Assistant Examiner* — Judy Dao Tran
(74) *Attorney, Agent, or Firm* — Kilpatrick Townsend & Stockton LLP

(57) ABSTRACT

The present application discloses a material handling system and a monitoring system and a monitoring method for particles in a traveling area of overhead hoist transfers, wherein the monitoring system for particles in the overhead hoist transfer traveling area comprises gas sampling modules, a particle counter and a monitoring device. The gas sampling module is configured to obtain the gas to be tested around traveling wheels of each overhead hoist transfer (OHT). The particle counter is configured to test the gas to be tested for the size and number of particles in the gas to be tested. The monitoring device is electrically connected to the particle counter, and is configured to acquire the size and
(Continued)

number of the particles tested and alarm when determining that the content of particles does not meet a preset standard.

17 Claims, 4 Drawing Sheets

(51) Int. Cl.
| | |
|---|---|
| *B66C 15/06* | (2006.01) |
| *G01N 1/24* | (2006.01) |
| *G01N 15/0205* | (2024.01) |
| *B66C 9/16* | (2006.01) |
| *B66C 11/00* | (2006.01) |
| *B66C 19/00* | (2006.01) |
| *G01N 15/075* | (2024.01) |
| *H01L 21/677* | (2006.01) |

(52) U.S. Cl.
CPC .................. *G01N 1/24* (2013.01); *B66C 9/16* (2013.01); *B66C 11/00* (2013.01); *B66C 19/00* (2013.01); *G01N 2015/0046* (2013.01); *G01N 15/075* (2024.01); *H01L 21/67733* (2013.01)

(58) Field of Classification Search
CPC ....... G01N 15/1459; G01N 2001/2291; G01N 2015/0046; G01N 2015/0693; G01N 2015/1486; G01N 15/10; G01N 2015/1062

See application file for complete search history.

(56) References Cited

U.S. PATENT DOCUMENTS

| | | | | |
|---|---|---|---|---|
| 2013/0291332 | A1* | 11/2013 | Nakao ...................... | B08B 5/02 |
| | | | | 15/347 |
| 2018/0129141 | A1 | 5/2018 | Lee et al. | |
| 2020/0047998 | A1* | 2/2020 | Tanaka .............. | H01L 21/67733 |
| 2020/0075375 | A1* | 3/2020 | Li ..................... | H01L 21/67028 |
| | | | | 15/301 |

FOREIGN PATENT DOCUMENTS

| | | | | |
|---|---|---|---|---|
| CN | 204185130 U | | 3/2015 | |
| CN | 104555743 A | | 4/2015 | |
| CN | 102192870 B | | 11/2015 | |
| CN | 109733335 | | 5/2019 | |
| CN | 109772069 A | | 5/2019 | |
| CN | 209169119 U | | 7/2019 | |
| CN | 110356856 A | * | 10/2019 | ............ B65G 57/32 |
| CN | 110398445 A | * | 11/2019 | ............ G01N 15/06 |
| CN | 110501455 A | | 11/2019 | |
| CN | 209878019 U | | 12/2019 | |
| JP | 2016189497 A | | 11/2016 | |
| KR | 20040038783 A | | 5/2004 | |
| KR | 20140137086 A | | 12/2014 | |
| KR | 20190072262 A | | 6/2019 | |
| TW | 202009200 A | | 3/2020 | |

OTHER PUBLICATIONS

First Office Action cited in CN202010135719.1 mailed Mar. 25, 2022, 21 pages.

* cited by examiner

MATERIAL HANDLING SYSTEM AND MONITORING SYSTEM AND MONITORING METHOD FOR PARTICLES IN TRAVELING AREA OF OVERHEAD HOIST TRANSFERS

CROSS REFERENCE TO RELATED APPLICATIONS

The present application claims the priority to Chinese Patent Application No. 202010135719.1, titled "Material handling system and monitoring system and monitoring method for particles in traveling area of overhead hoist transfers", filed on Mar. 2, 2020, which is incorporated herein by reference in its entirety.

TECHNICAL FIELD

The present application relates to a material handling system and a monitoring system and a monitoring method for particles in a traveling area of overhead hoist transfers.

BACKGROUND

Semiconductor manufacturing has very strict requirements on cleanliness, and the environmental cleanliness in a wafer factory is 1,000, that is, there shall be no more than 1,000 particles with a diameter of 0.1 μm≤D≤0.3 μm in 1 m³ space. The requirements for the internal environment of a process machine are even more stringent, with a cleanliness of 10. Thus, it is very important to test and control particles in semiconductor industry. A traditional automatic material handling system comprises overhead hoist transfers (OHT) and tracks, and traveling wheels of each OHT move along the tracks to handle wafers. In order to ensure cleanliness, the tracks and the OHTs are generally cleaned on a regular basis or in case of fault alarm.

SUMMARY

According to various embodiments, the present application provides a monitoring system for particles in a traveling area of overhead hoist transfers, comprising: gas sampling modules each configured to obtain gas to be tested around traveling wheels of each overhead hoist transfer (OHT); a particle counter which is connected to the gas sampling module, and is configured to test the gas to be tested for the size and number of particles in the gas to be tested; and a monitoring device which is electrically connected to the particle counter, and is configured to acquire the size and number of the particles tested and alarm when determining that the content of particles does not meet a preset standard.

According to various embodiments, the present application further provides a material handling system, comprising the monitoring system for particles in a traveling area of overhead hoist transfers and further comprising overhead hoist transfers (OHT) and tracks, wherein each OHT is movably arranged on the tracks, and gas sampling modules are arranged on the OHT.

According to various embodiments, the present application further provides a monitoring method for particles in a traveling area of overhead hoist transfers, comprising following steps of:
obtaining, by gas sampling modules, the gas to be tested around traveling wheels of each overhead hoist transfer (OHT);
testing, by a particle counter, the gas to be tested for the size and number of particles in the gas to be tested; and
alarming by a monitoring device when determining that the content of particles does not meet a preset standard.

Other features and advantages of the present application will become apparent in the specification, the accompanying drawings, and the claims.

BRIEF DESCRIPTION OF THE DRAWINGS

In order to more clearly illustrate the embodiments of the present application or the technical solutions in traditional technologies, the accompanying drawings to be used in the embodiments or the description of traditional technologies will be briefly described below. Obviously, the accompanying drawings in the following description are merely some embodiments described in the present application, and those of ordinary skill in the art may also obtain other accompanying drawings based on these accompanying drawings without paying any creative efforts.

DETAILED DESCRIPTION

Figure 1:
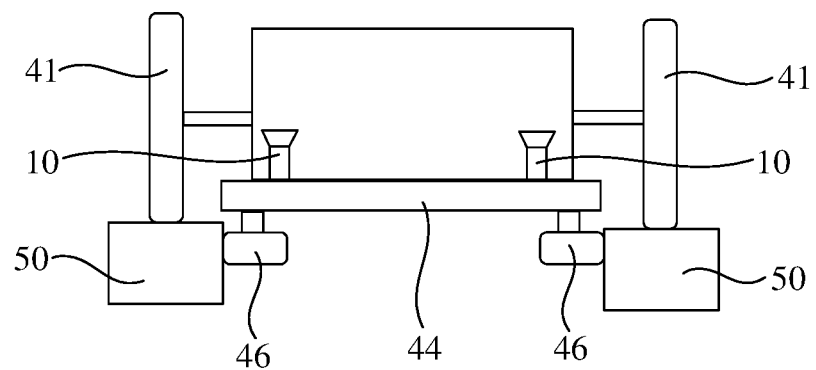
FIG. 1 is a front structure view of an overhead hoist transfer (OHT) installed on tracks according to an embodiment of the present application.
Figure 2:
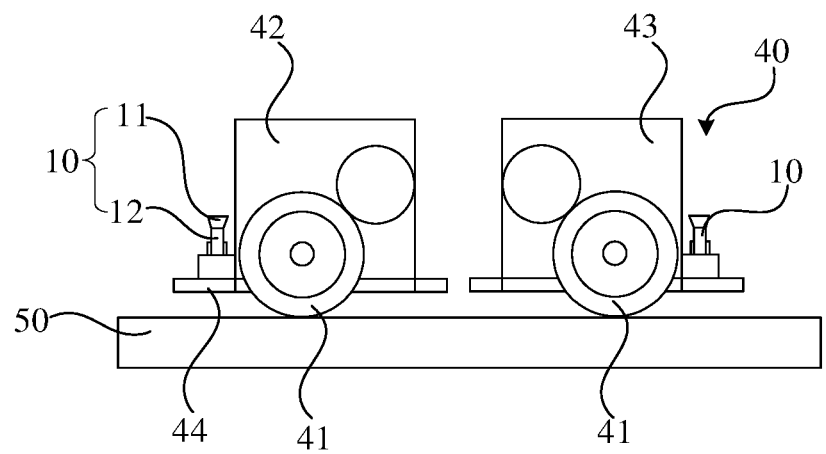
FIG. 2 is a side structure view of the OHT installed on the tracks according to an embodiment of the present application.
Figure 3:
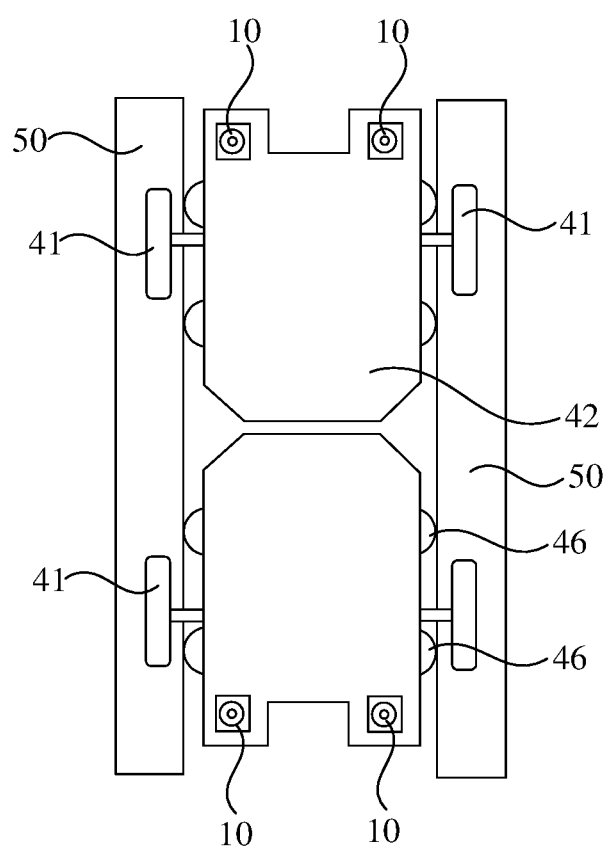
FIG. 3 is a top structure view of the OHT installed on the tracks according to an embodiment of the present application.
Figure 4:
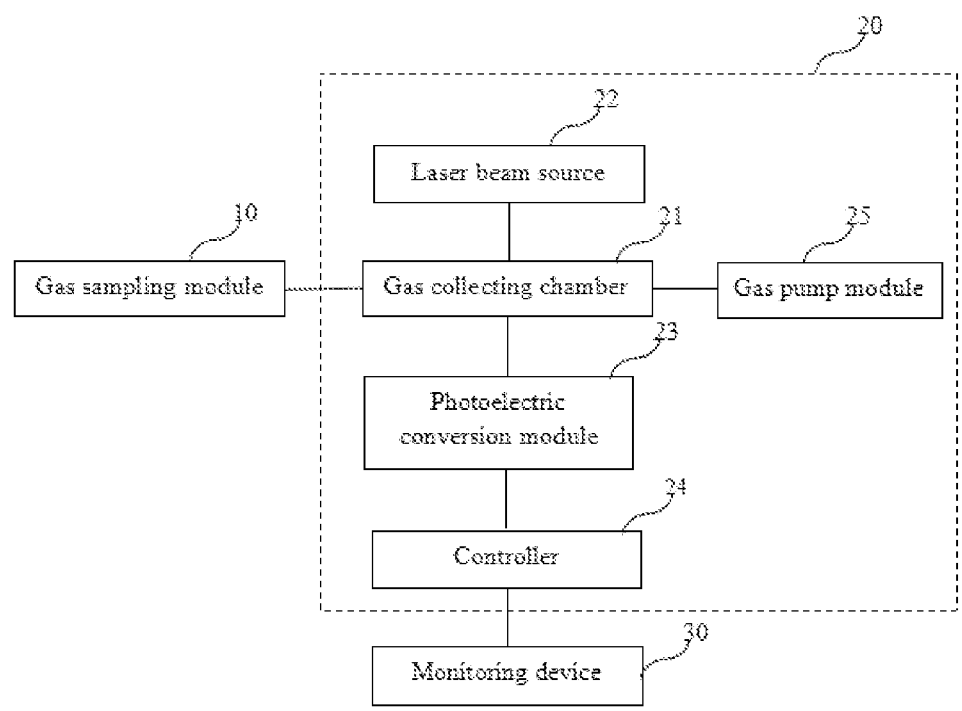
FIG. 4 is a structural diagram of a monitoring system for particles in a traveling area of overhead hoist transfers according to an embodiment of the present application.

Generally, tracks and overhead hoist transfers (OHT) are cleaned on a regular basis or in case of fault alarm, in which case no standard is available for determining a cleaning interval, and the cleaning effect is not ideal, thus contaminating electrical components on the tracks and photoelectric sensors (sensors) of the OHT, and also shortening the service life of a motor of the OHT.

To make the above objectives, features and advantages of the present application clearer or easier to understand, the embodiments of the present application will be described in detail with reference to the accompanying drawings. The following description contains numerous specific details to provide a thorough understanding of the present application. However, the present application can be implemented in many other ways different from those described herein, and those of skill in the art can make similar improvements without departing from the connotation of the present application, so the present application is not limited by the specific embodiments disclosed below.

In the description of the present application, it should be understood that the terms "first" and "second" are merely used for descriptive purposes, and are not to be construed as indicating or implying relative importance or implicitly indicating the number of indicated technical features. Therefore, the features defined with "first" and "second" may explicitly or implicitly include at least one of the features. In the description of the present application, "a plurality of" means at least two, e.g., two and three, unless otherwise expressly and specifically defined.

In the description of the present application, it should be understood that when one component is considered to be "connected" to another component, it may be connected to another component directly or by an intermediate component at the same time. In contrast, when one element is considered to be "directly" connected to another element, there is no intermediate component.

Generally, when traveling wheels 41 of a conventional overhead hoist transfer (OHT) 40 moves along tracks 50 to handle wafers, the traveling wheels and guide wheels of the OHT 40 will be worn out after long time operation, thereby generating particles, that is, the content of particles around the traveling wheels of the OHT 40 will increase with the operation time, thus contaminating electrical components on the tracks 50 and photoelectric sensors (sensors) of the OHT 40, and also shortening the service life of a motor of the OHT 40.

In an embodiment, with reference to FIGS. 1 to 5, a monitoring system for particles in a traveling area of overhead hoist transfers comprises gas sampling modules 10, a particle counter 20 and a monitoring device 30. The gas sampling module 10 is configured to obtain the gas to be tested around traveling wheels 41 of an OHT 40. The particle counter 20 is connected to the gas sampling modules 10, and is configured to test the gas to be tested for the size and number of particles in the gas to be tested. The monitoring device 30 is electrically connected to the particle counter 20, and is configured to acquire the size and number of the particles tested and alarm when determining that the content of particles does not meet a preset standard.

According to the monitoring system for particles in a traveling area of overhead hoist transfers, the gas to be tested around the traveling wheels 41 of the OHT 40 is sampled by the gas sampling modules 10 and then tested by the particle counter 20 for the size and number of particles in the gas to be tested, and the monitoring device 30 alarms when determining that the content of particles does not meet a preset standard, i.e., the content of particles does not meet the preset standard, so as to timely prompt related personnel to clean the OHT 40 and the tracks 50, which can improve the cleaning effect, reduce the degree of contamination on the electrical components, and prolong the service life of a motor of the OHT 40. In addition, the test data of particles may also provide an effective basis for the cleaning interval of the tracks 50, so as to improve the cleaning effect and ensure the cleanliness requirements.

It should be noted that the particle counter 20 may effectively test the size and number of particles. Specifically, the particle counter 20 counts particles mainly according to the light scattering principle, so the particle diameter can be calculated since the scattered light intensity varies with particle sizes. A laser beam passes through a certain flow of gas containing particles, causing the particles to emit scattered light, which is projected through a condenser lens onto a photomultiplier to convert light pulses into electric pulses, and the number of particles can be obtained based on the number of pulses.

Further, with reference to FIGS. 1 to 5, the gas sampling modules 10 are arranged on supports 44 of the traveling wheels 41 of the OHT 40. In this way, it is easy for installation and also can enable the gas sampling modules 10 to obtain the gas to be tested around the traveling wheels 41. Optionally, the gas sampling module 10 may also be installed in other positions of the OHT 40, such as on a front gearbox 42 or a rear gearbox 43.

Further, with reference to FIGS. 1 to 5, there are four gas sampling modules 10, with two gas sampling modules 10 respectively arranged on two sides of the front gearbox 42 of the OHT 40 and two gas sampling modules 10 respectively arranged on two sides of the rear gearbox 43 of the OHT 40. That is, the four gas sampling modules 10 are respectively arranged in one-to-one correspondence with the four traveling wheels 41 of the OHT 40, so that the gas to be tested around the four traveling wheels 41 can be sampled. In practice, when the OHT 40 moves to a preset measuring point of the track 50, on the one hand, the gas to be tested can be sampled by the four gas sampling modules 10 and sequentially delivered to the particle counter 20 to test the size and number of particles of the gas to be tested around the four traveling wheels 41 when the OHT 40 is located at the measuring point, and an average of the test values of the gas to be tested around the four traveling wheels 41 is taken as one of the test values of the measuring point, so that the test result is more accurate; on the other hand, the gases to be detected sampled by the four gas sampling modules 10 may also be mixed and delivered to the particle counter 20 for testing.

Alternatively, there may also be another number of the gas sampling modules 10 on the OHT 40, such as one, two or three, which is not limited herein.

In an embodiment, with reference to FIGS. 1 to 5, each gas sampling module 10 comprises a probe 11 and a gas collecting tube 12. The probe 11 is connected to the gas collecting tube 12. In addition, the particle counter 20 comprises a gas collecting chamber 21, a laser beam source 22, a photoelectric conversion module 23, a controller 24 and a gas pump module 25. A gas inlet of the gas collecting chamber 21 is communicated with the gas collecting tube 12 while a gas outlet thereof is communicated with the gas pump module 25, the laser beam source 22 and the photoelectric conversion module 23 are respectively arranged on two sides of the gas collecting chamber 21, and the controller 24 is electrically connected to the photoelectric conversion module 23. In operation, the gas pump module 25 provides a pumping force to pump the gas to be tested around the traveling wheel 41 into the gas collecting chamber 21 through the gas sampling module. The laser beam source 22 emits a laser beam from one side of the gas collecting chamber 21, and the laser beam passes through a certain flow of gas to be tested containing particles, causing the particles to emit scattered light, which is projected by the condenser lens onto the photomultiplier of the photoelectric conversion module 23 to convert light pulses into electric pulses, and the number of particles can be obtained based on the number of pulses.

In addition, specifically, in the process of testing the gas to be tested at the measuring point, when the monitoring device 30 determines that there are more than 1,000 particles with a diameter of 0.1 μm≤D≤0.3 μm in the gas to be tested, it indicates that the cleanliness of the environment around the traveling wheels 41 does not meet a preset cleanliness standard. In this case, the monitoring device 30 alarms and gives a prompt. Test duration with the OHT 40 staying at the measuring point on the track 50 each time is, for example, 30 s to 120 s, which may be 30 s, 45 s, 60 s, 75 s, 90 s or 120 s.

Further, the gas pump module 25 comprises a pump body and a filter. The pump body is configured to provide power to pump the gas out of the gas collecting chamber 21. In addition, the filter is arranged on the pump body and configured to filter the gas pumped out of the gas collecting chamber 21. In this way, the content of particles in the surrounding environment of the tracks 50 and the traveling wheels can be reduced after the gas pumped out of the gas collecting chamber 21 is filtered by the filter.

In one embodiment, the controller 24 is electrically connected to a control module of the OHT 40 which is electrically connected to the monitoring device 30.

In an embodiment, with reference to FIGS. 1 to 5, the OHT 40 further comprises hangers 45 located below tracks 50. An area 451 between the hangers 45 corresponding to a transfer portion holding wafers is used for accommodating the particle counter 20. In this way, the transfer portion holding wafers may be removed from the hangers 45 of the OHT 40 and replaced with the particle counter 20. That is, instead of holding and moving wafers to a predetermined position by the transfer portion, the OHT 40 is provided with the particle counter 20 to test the gas to be tested. In this way, when the OHT 40 moves to different measuring points along the tracks 50, the gases to be tested around the traveling wheels 41 at different measuring points are sampled by the sampling modules correspondingly and tested by the particle counter 20 for the size and number of particles in the gas to be tested.

In an embodiment, please refer to FIG. 1 to FIG. 5, a material handling system comprises the monitoring system for particles in a traveling area of overhead hoist transfers described in any one of the above embodiments, and further comprises overhead hoist transfers (OHT) 40 and tracks 50. The OHT 40 is movably arranged on the tracks 50, and gas sampling modules 10 are arranged on the OHT 40.

According to the above material handling system, the gas to be tested around the traveling wheels 41 of the OHT 40 is sampled by the gas sampling modules 10 and then tested by the particle counter 20 for the size and number of particles in the gas to be tested, and the monitoring device 30 alarms when determining that the content of particles does not meet a preset standard, i.e., the content of particles does not meet the preset standard, so as to timely prompt related personnel to clean the OHT 40 and the tracks 50, which can improve the cleaning effect, reduce the degree of contamination on the electrical components, and prolong the service life of a motor of the OHT 40. In addition, the test data of particles may also provide an effective basis for the cleaning interval of the tracks 50, so as to improve the cleaning effect and ensure the cleanliness requirements.

Further, with reference to FIGS. 1 to 5, the OHT 40 is further provided with anti-tip wheels 46 each moving along a sidewall of the track 50. Specifically, there are two tracks 50 spaced in parallel, and two corresponding anti-tip wheels 46 of the OHT 40 which are respectively in moving contact-fit with inner sidewalls of the two tracks 50 to play an anti-tip role in the process of the OHT 40 moving along the tracks 50.

Figure 5:
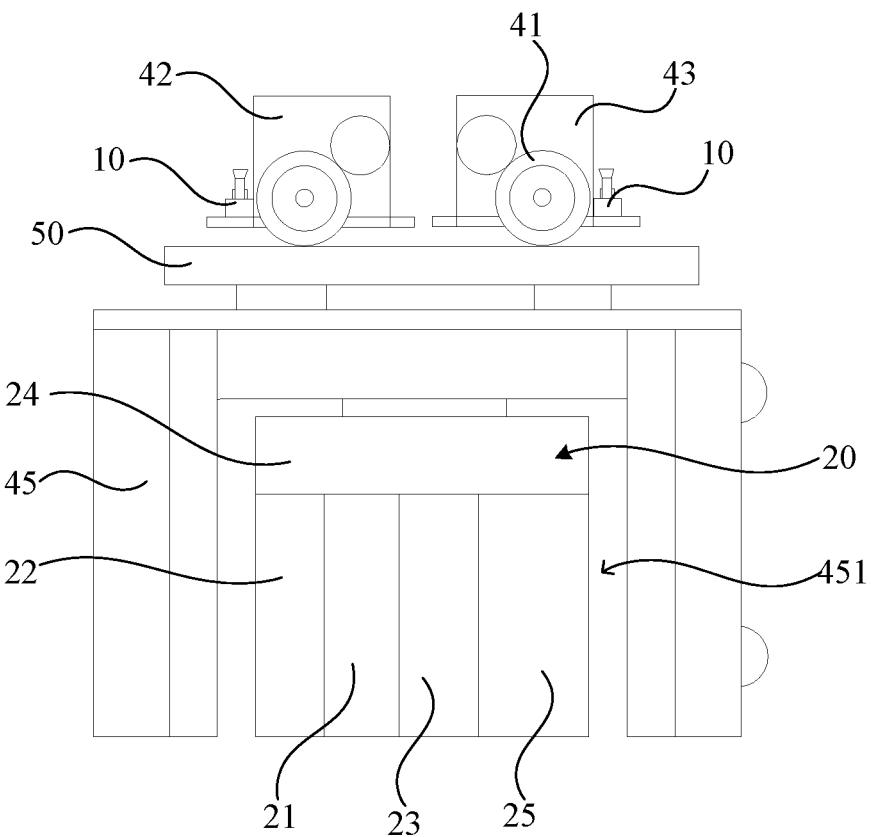
FIG. 5 is a structural diagram of a material handling system provided with a monitoring system for particles in a traveling area of overhead hoist transfers according to an embodiment of the present application.
Figure 6:
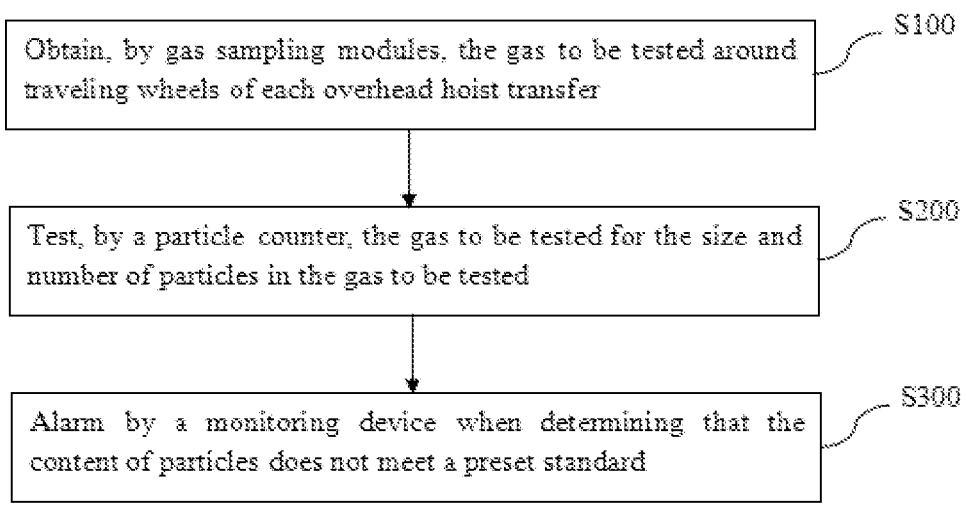
FIG. 6 is a flowchart of a monitoring method for particles in a traveling area of overhead hoist transfers according to an embodiment of the present application, in which:
10: gas sampling module; 11: probe; 12: gas collecting tube; 20: particle counter; 21: gas collecting chamber; 22: laser beam source; 23: photoelectric conversion module; 24: controller; 25: gas pump module; 30: monitoring device; 40: overhead hoist transfer (OHT); 41: traveling wheel; 42: front gearbox; 43: rear gearbox; 44: support; 45: hanger; 451: area; 46: anti-tip wheel; and 50: track.

In an embodiment, with reference to FIG. 5 and FIG. 6, a monitoring method for particles in a traveling area of overhead hoist transfers comprises the following steps S100 to S300.

At the S100, the gas to be tested around traveling wheels 41 of each overhead hoist transfers (OHT) 40 is sampled by gas sampling modules 10.

At the S200, the gas to be tested is tested by a particle counter 20 for the size and number of particles in the gas to be tested.

At the S300, the monitoring device 30 alarms when determining that the content of particles does not meet a preset standard.

The monitoring method for particles in a traveling area of overhead hoist transfers can timely prompt related personnel to clean the OHTs 40 and the tracks 50, which can improve the cleaning effect, reduce the degree of contamination on the electrical components, and prolong the service life of a motor of the OHT 40. In addition, the test data of particles may also provide an effective basis for the cleaning interval of the tracks 50, so as to improve the cleaning effect and ensure the cleanliness requirements.

Further, the monitoring method for particles in a traveling area of overhead hoist transfers further comprises following steps.

The traveling area of the OHTs 40 in a wafer factory is divided into a plurality of test groups, several measuring points in each test group are provided.

Specifically, the OHT 40 traveling area in the wafer factory is divided into the several test groups according to bays (the bay refers to groups of production units in the production line, and there are many production machines in one bay). For example, a gluing production unit is correspondingly provided with test groups, and the production unit in an etching area is also correspondingly provided with test groups.

In addition, the several measuring points are spaced along the test groups. The measuring points in each test group may be the same or different, and there may be two, three or four measuring points.

The OHTs move through all the test groups in sequence in order to test the size and number of particles at the several measuring points in the test groups in sequence.

The test data of particles at the several measuring points in the test groups are calculated by a preset algorithm to obtain test data of particles in the test groups.

It is determined whether the test data of particles at each measuring point in the test group is within a first preset range or not, and if not, the related personnel are prompted to clean the test group corresponding to the measuring point and to clean the OHTs.

It is determined whether the test data of particles in the test group is within a second preset range or not, and if not, the related personnel is prompted to clean the test group.

Specifically, the second preset range is different from the first preset range, and the first preset range and the second preset range may be set according to actual conditions.

Further, the step of determining that the test data of particles in the test group is out of the second preset range further comprises following steps of: counting the OHTs 40 moving through the test groups, determining the OHTs 40 moving through the test groups the most frequently or at a frequency higher than a preset frequency, and cleaning the determined OHTs 40.

Further, the step of calculating the test data of particles at the several measuring points in the test groups by a preset algorithm to obtain test data of particles in the test groups specifically comprises a step of: averaging the test data of particles at the several measuring points in the test groups to obtain the test data of particles in the test groups.

Further, the monitoring method for particles in a traveling area of overhead hoist transfers further comprising following steps of: testing the size and number of particles at the measuring points in the test groups at least twice, and taking an average of the values as the test data of particles at the measuring points.

Further, the step of enabling the OHTs to move through all the test groups in sequence and testing the size and number of particles at the several measuring points in the test groups in sequence specifically comprises a step of: enabling the OHTs to move through all the test groups in sequence at a set interval. The set interval may be, for example, 10 h, 20 h, 30 h, 40 h, 50 h or 100 h according to actual conditions. That is, the OHT 40 in this embodiment is configured to test the particles in each test group at the set interval, to ensure that the cleanliness of the OHTs and the tracks meets the requirements.

The monitoring method for particles in a traveling area of overhead hoist transfers further comprises following steps of: analyzing a data-changing trend based on the test data of particles at the measuring points at each interval and the test data of particles in the test groups, and adjusting the set interval according to the data-changing trend.

Specifically, when it is tested that there are few particles with an inner diameter of 0.1 $\mu m \leq D \leq 0.3$ $\mu m$ per unit volume, it indicates that the cleanliness of the environment around the traveling wheels 41 is up to the preset cleanliness standard, and the smaller the number, the higher the cleanliness. In this case, the set interval may be prolonged without a need to clean frequently. When it is tested that there are a large number of particles with an inner diameter of 0.1 $\mu m \leq D \leq 0.3 p$ m per unit volume, which are far beyond the preset range, it indicates that the cleanliness of the environment around the traveling wheels 41 is far below the preset cleanliness standard, and the larger the number, the lower the cleanliness. In this case, the set interval may be shortened, and the OHTs and the tracks need to be cleaned relatively more frequently to ensure the cleaning effect.

The technical features of the above embodiments may be combined in any number of ways. For the sake of brevity, not all possible combinations of the technical features of the above embodiments have been described. However, any combination of these technical features without contradictions shall fall into the scope described herein.

The above embodiments describe only a few of the embodiments of the present application specifically and in detail, but shall not be construed as limiting the scope of the patent application. It should be noted that a number of variations and improvements may be made by those of ordinary skill in the art without departing from the concept of the present application, and shall fall into the protection scope of the present application. Therefore, the scope of protection of the present application shall be subject to the appended claims.

The invention claimed is:

1. A monitoring system for particles in a traveling area of overhead hoist transfers, comprising:
   four gas collectors, two gas collectors respectively arranged on two sides of a front gearbox of each overhead hoist transfer and two gas collectors respectively arranged on two sides of a rear gearbox of each overhead hoist transfer: each gas collector comprises a probe and a gas collecting tube, and the probe is connected to the gas collecting tube, each gas collector configured to obtain gas to be tested around traveling wheels of each overhead hoist transfer;
   a particle counter, connected to the four gas collectors, and configured to test the gas to be tested for the size and number of particles in the gas to be tested; and
   an alarm apparatus, electrically connected to the particle counter, and configured to acquire the size and number of the particles tested and alarm when determining that a content of particles does not meet a preset standard.

2. The monitoring system for particles in a traveling area of overhead hoist transfers according to claim 1, wherein each gas collector is arranged on a support of the traveling wheels of each overhead hoist transfer.

3. The monitoring system for particles in a traveling area of overhead hoist transfers according to claim 1, wherein the particle counter comprises a gas collecting chamber, a laser beam source, a photoelectric conversion module, a controller and a gas pump module, a gas inlet of the gas collecting chamber is communicated with the gas collecting tube while a gas outlet thereof is communicated with the gas pump module, the laser beam source and the photoelectric conversion module are respectively arranged on two sides of the gas collecting chamber, and the controller is electrically connected to the photoelectric conversion module.

4. The monitoring system for particles in a traveling area of overhead hoist transfers according to claim 3, wherein the gas pump module comprises a pump body and a filter; the pump body is configured to provide power to pump the gas out of the gas collecting chamber, and the filter is arranged on the pump body and configured to filter the gas pumped out of the gas collecting chamber.

5. The monitoring system for particles in a traveling area of overhead hoist transfers according to claim 1, wherein each overhead hoist transfer further comprises hangers which are located below tracks and configured to accommodate the particle counter.

6. A material handling system, comprising the monitoring system for particles in a traveling area of overhead hoist transfers according to claim 1, and further comprising tracks, wherein each overhead hoist transfer is movably arranged on the tracks, and each gas collector is arranged on each overhead hoist transfer.

7. The material handling system according to claim 6, wherein each overhead hoist transfer is further provided with anti-tip wheels each moving along a sidewall of the tracks.

8. A monitoring method for particles in a traveling area of overhead hoist transfers, comprising following steps of:
   obtaining, by four gas collectors, gas to be tested around traveling wheels of each overhead hoist transfer;
   testing, by a particle counter, the gas to be tested for the size and number of particles in the gas to be tested; and
   alarming by an alarm apparatus when determining that the content of particles does not meet a preset standard.

9. The monitoring method for particles in a traveling area of overhead hoist transfers according to claim 8, further comprising following steps of:
   dividing the traveling area of each overhead hoist transfer in a wafer factory into a plurality of test groups, providing several measuring points in each test group;
   enabling each overhead hoist transfer to move through all the test groups in sequence, and testing the size and number of particles at the several measuring points in the test groups in sequence;
   calculating test data of particles at the several measuring points in the test groups by a preset algorithm to obtain the test data of particles in the test groups;
   determining whether the test data of particles at each measuring point in the test group is within a first preset range or not, and if not, giving a prompt to clean the test group corresponding to the measuring point and to clean the overhead hoist transfer; and determining whether the test data of particles in the test group is within a second preset range or not, and if not, giving a prompt to clean the test group.

10. The monitoring method for particles in a traveling area of overhead hoist transfers according to claim 8, wherein in the step of determining that the test data of particles in the test group is out of the second preset range, further comprises: counting the overhead hoist transfers moving through the test groups, determining the overhead hoist transfers moving through the test groups the most frequently or at a frequency higher than a preset frequency, and cleaning the determined overhead hoist transfers.

11. The monitoring method for particles in a traveling area of overhead hoist transfers according to claim 9, wherein the step of calculating the test data of particles at the several measuring points in the test groups by a preset algorithm to obtain the test data of particles in the test groups specifically comprises:

averaging the test data of particles at the several measuring points in the test groups to obtain the test data of particles in the test groups.

12. The monitoring method for particles in a traveling area of overhead hoist transfers according to claim 9, further comprising following steps of: testing the size and number of particles at the measuring points in the test groups at least twice, and taking an average of the values as the test data of particles at the measuring points.

13. The monitoring method for particles in a traveling area of overhead hoist transfers according to claim 9, wherein the step of enabling each overhead hoist transfer to move through all the test groups in sequence and testing the size and number of particles at the several measuring points in the test groups in sequence comprises: enabling each overhead hoist transfer to move through all the test groups in sequence at a set interval; and analyzing a data-changing trend based on the test data of particles at the measuring points at each interval and the test data of particles in the test groups, and adjusting the set interval according to the data-changing trend.

14. The monitoring method for particles in a traveling area of overhead hoist transfers according to claim 13, wherein the set interval is 10 h, 20 h, 30 h, 40 h, 50 h or 100 h.

15. The monitoring system for particles in a traveling area of overhead hoist transfers according to claim 2, wherein each overhead hoist transfer further comprises hangers which are located below tracks and configured to accommodate the particle counter.

16. A material handling system, comprising the monitoring system for particles in a traveling area according to claim 2, and further comprising overhead hoist transfers and tracks, wherein each overhead hoist transfer is movably arranged on the tracks, and each gas collector is arranged on each overhead hoist transfer.

17. A material handling system, comprising the monitoring system for particles in a traveling area according to claim 1, and further comprising overhead hoist transfers and tracks, wherein each overhead hoist transfer is movably arranged on the tracks, and each gas collector is arranged on each overhead hoist transfer.

* * * * *